(12) United States Patent
Lejeune

(10) Patent No.: US 6,813,740 B1
(45) Date of Patent: Nov. 2, 2004

(54) METHOD FOR THE TESTING OF ELECTRONIC COMPONENTS

(75) Inventor: Philippe Lejeune, Sours (FR)

(73) Assignee: Softlink, Dourdan (FR)

( * ) Notice: Subject to any disclaimer, the term of this patent is extended or adjusted under 35 U.S.C. 154(b) by 453 days.

(21) Appl. No.: 09/692,290

(22) Filed: Oct. 19, 2000

(30) Foreign Application Priority Data

Oct. 21, 1999 (FR) .............................................. 99 13396

(51) Int. Cl.[7] .......................... G01R 31/28; G06F 11/00
(52) U.S. Cl. ....................................... 714/736; 714/718
(58) Field of Search ................................. 714/718, 726, 714/733, 724, 723, 719, 736, 742, 701, 715

(56) References Cited

U.S. PATENT DOCUMENTS

| 5,506,849 A | 4/1996 | Kato |
| 5,841,789 A | 11/1998 | McClure |

FOREIGN PATENT DOCUMENTS

| EP | 0 867 887 | 9/1998 |
| WO | WO99/44752 | 9/1999 |

OTHER PUBLICATIONS

Jackson et al., *Measurement Techniques Testing High Speed Memories*, Computer Design, vol. 14, No. 5, May 1975, pp. 127–132.

*Primary Examiner*—Guy J. Lamarre
*Assistant Examiner*—Mujtaba Chaudry
(74) *Attorney, Agent, or Firm*—Patterson, Thuente, Skaar & Christensen, P.A.

(57) ABSTRACT

Testing of an electronic component (1) in which a signal (S1) is sent to a cell (3) of the component, and the output signal (S2) of this component is studied so as to define whether the component is acceptable or not. If the component is acceptable the test is performed again by sending a signal (S1') similar to the first signal but with a shorter duration (T2). A search is then made for an output signal (S2') to be compared with a compressed expected pattern. If this test, which is performed more rapidly, is valid, it can be planned, if necessary, to use this faster input signal on following components to be tested.

22 Claims, 3 Drawing Sheets

|  | Tr1 | Tr2 | Tr3 | ... | Trx |
|---|---|---|---|---|---|
| Test 1 | X | X |  |  |  |
| Test 2 | X | X | X |  |  |
| ⋮ |  |  |  |  |  |
| Test N | X | X |  |  |  |

METHOD FOR THE TESTING OF ELECTRONIC COMPONENTS

BACKGROUND OF THE INVENTION

1. Field of the Invention

An object of the present invention is a method for the testing of electronic components. It can be used more particularly in the field of tests on batches of electronic components when they come off the production line, especially tests made on memory type electronic components and, in particular, flash memory type components. In the prior art, there are known methods that are repeated identically on components of one and the same type, these components coming from one and the same manufactured batch, or from one or more production lines. The value of the invention lies in the fact that it proposes a method of testing that gradually reduces the time taken to perform one and the same test on one and the same type of component.

2. Description of the Prior Art

In the prior art, there is a known machine for testing electronic components such as memory components of an integrated circuit. In general, at an output of a production line, components are arranged on wafers. A wafer may comprise up to a hundred memory components to be tested. Each of the memory components is tested integrally, and the test is performed individually and independently of the other tests to be made on other components of the wafer.

An electronic component comprises chiefly cells and inputs and outputs. These inputs and outputs are used for communication with inputs and outputs of cells. For example, a memory component may be constituted by 256 K memory cells such that each of the memory cells has an input and an output. Furthermore, this memory component may comprise, in one example, 32 inputs and 32 outputs. In general, a memory cell of an electronic component such as this is a transistor. In one example, this transistor may have eight different output states. In this example, for memory components to be tested, a memory cell may be positioned at eight distinct voltage levels. These levels can range from 1.5 to 2.5 volts, depending on the size of the memory components. A voltage level of the memory cell is then encoded in three bits.

In the prior art, there are therefore known testing machines capable of successively performing tests on each memory cell of a memory to ascertain that the memory component is valid. The nature and the modalities of the performance of the tests are generally defined beforehand on a theoretical basis. In particular, in theoretical terms, a historical pattern of tests to be sent in each of the cells to be tested is provided and, in theoretical terms, as a function of these tests, patterns of states are defined. Given the nature and the historical pattern of the initial signal sent, the memory cell must theoretically pass through these patterns of states.

Since the historical patterns of the theoretical tests are set up when starting, during the designing of a component, the testing times determined for the testing of this component allow for considerable safety margins as regards the success of the tests. Furthermore, the historical test patterns and their period of implementation do not take account of the improvements achieved in production. Indeed, a modification of one of the historical test patterns or of its duration may have consequences that are hard to assess theoretically. Hence, the historical patterns of the initial historical tests are not modified or, if they are, it is very rare that it is done. The durations of the tests are therefore given values substantially in excess of what they could be. Hence, in the prior art, the performance of such tests on electronic components is a very lengthy process.

In the prior art, there is a known test method to slightly reduce the total testing duration of an electronic component. In this method, several cells of the component are tested simultaneously. Indeed, since a component can have up to 32 inputs it is possible, in this case, to test up to 32 cells simultaneously. Since each test consists in sending a non-monotonic electric signal for a certain duration, signal-coupling problems may appear. Indeed, tests are theoretically defined such that these tests can be sent simultaneously. However, if it is sought to modify some of these tests, there is the risk of emergence of some of these coupling phenomena. Indeed, since the combinations of the different signals sent on the 32 inputs of the component to 32 cells to be tested of this component are excessively complex, they cannot be easily optimized. Hence, the test methods set up in the prior art are kept unchanged, and no system of continuous optimization is set up.

It is an object of the invention to overcome the problems referred to by proposing a test method to gradually optimize the duration of a test performed on an electronic component. The solution of the invention consists of a method to test an electronic component such that, in a first stage, a signal is sent to a cell to be tested of the component. This first signal sent is non-monotonic. Generally, it has a complex shape and is defined by a historical pattern that is a sequence of variations of values in a certain duration.

The signal may be sent, for example, from an analog-digital converter expressing a table of values corresponding to the values of the historical pattern to be processed. The analog-digital converter is then controlled by a clock that defines a speed of transmission of the electrical signal and, therefore, the duration of this signal. This signal is sent to a cell in particular of the component to be tested.

After a certain period of time, the receiver cell sends a response. This response is measured. It is generally an electric signal type of response comprising a pattern of electrical states through which the cell passes under the effect of the received signal. Since, in the particular example referred to, the cell can be placed in eight different states, a pattern of states of the cell can be represented, for example, by a stepped curve with eight levels. Then, an assessment is made to see if this pattern of states obtained is in conformity with an expected pattern of states. In other words, the pattern of states is compared with acceptance criteria that are either lower or higher for elementary steps of the pattern of states.

The method according to the invention proposes that the test should be carried out again by compressing the duration of the historical pattern of the initial signal. Thus the same signal is sent. This signal has, on the whole, the same characteristics as the first signal sent, except that it is done on a smaller duration. As a result, the pattern of states through which the cell passes is obtained more quickly, and this pattern of states itself has a shorter duration. Then, if the pattern of states obtained conforms or does not conform to an equally compressed pattern of states that is expected, the component is accepted or rejected.

The expected pattern of states may be obtained by compressing the initial expected pattern of states in the same way as the initial sent signal was compressed to give the signal with the compressed historical pattern. To reduce the duration of the tests gradually as and when the components are tested, it may be planned for example to take account of this new historical pattern of sent signals as being the signal to be sent to a new component to be tested. In this case, a new component is tested immediately with a compressed testing time.

SUMMARY OF THE INVENTION

The invention therefore relates to a method for the testing of an electronic component wherein:
- a first signal is sent, with first duration, with a first non-monotonic historical pattern to a first cell of the component,
- a measurement is made of a result represented by a first pattern of electric states of the first cell,
- the component is accepted if the first pattern of states conforms to an expected pattern, wherein
- the duration of the historical pattern of the first signal is compressed,
- a compressed pattern of corresponding states is measured, and
- the component is accepted if the compressed pattern of states conforms to an expected compressed pattern.

BRIEF DESCRIPTION OF THE DRAWINGS

The invention will be understood more clearly from the following description and the accompanying figures. These figures are given purely by way of an indication and in no way restrict the scope of the invention. Of the figures.

MORE DETAILED DESCRIPTION

Figure 1:
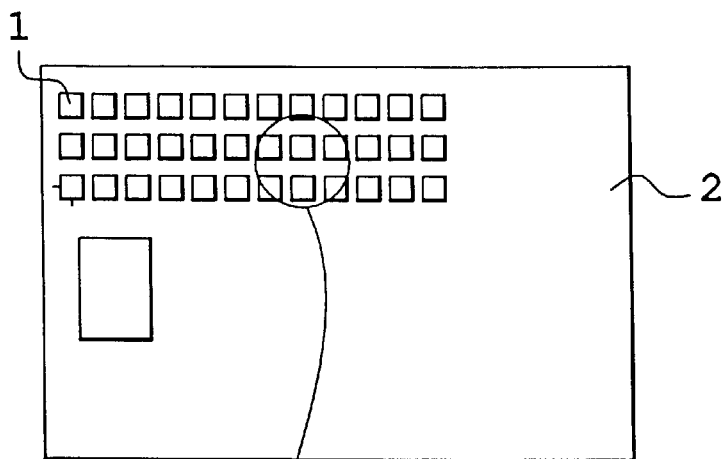
FIG. 1 shows a view of the electronic component to be tested according to the invention.

A test method according to the invention is designed to test an electronic component 1, par example positioned on a wafer 2 as shown in FIG. 1. The wafer 2 may comprise up to several thousands of electronic components such as 1 to be tested. In a preferred example, the wafer 2 comprises electronic integrated circuits, each comprising at least one memory component 1. The memory component 1 may be, for example, a Flash-EPROM type memory. Each memory component 1 positioned on the wafer 2 must be tested according to a test method of the invention.

More particularly, a memory component 1 has memory cells 3 such that each of the memory cells 3 has to be tested. More generally, all the memory cells 3 of the wafer 2 must be tested.

A memory cell 3 is, for example, a transistor. For example, a transistor may be a simple transistor. In the example shown in FIG. 2, the transistor of the memory cell 3 is a transistor provided with a double gate such that it has an input channel 4, capable of receiving variable voltages, and such that it comprises an output channel 5 to send an output signal in correspondence with the input signal received and the state of storage of the memory cell. The output signal also has variable voltages. In the example shown in FIG. 2, given that the transistor has a double gate, an output signal at the output 5 may have up to 8 different states.

Since the electronic components concerned are very small, it is necessary to send low voltage signals. Hence an input signal at the input channel 4 generally ranges from 1.5 to 2.5 volts. A signal of this kind can be sent, in the channel 4, by means of one of the input pins 6 of the memory component 1. Indeed, the memory 1 may for example comprise 16 or 32 input pins and, respectively 16 or 32 output pins. Now, generally, a component 1 has more than 32 cells. Hence a signal sent on input pins generally comprises also an addressing signal to designate one of the memory cells, among those of the memory 1, to be tested. The signal sent on the output channel 5 of a memory cell 3 is received at an output pin 7 of the memory component 1. Depending on the number of input pins such as 6 of the memory component 1, it is possible to communicate with one and the same number of memory cells simultaneously.

Figure 2A:
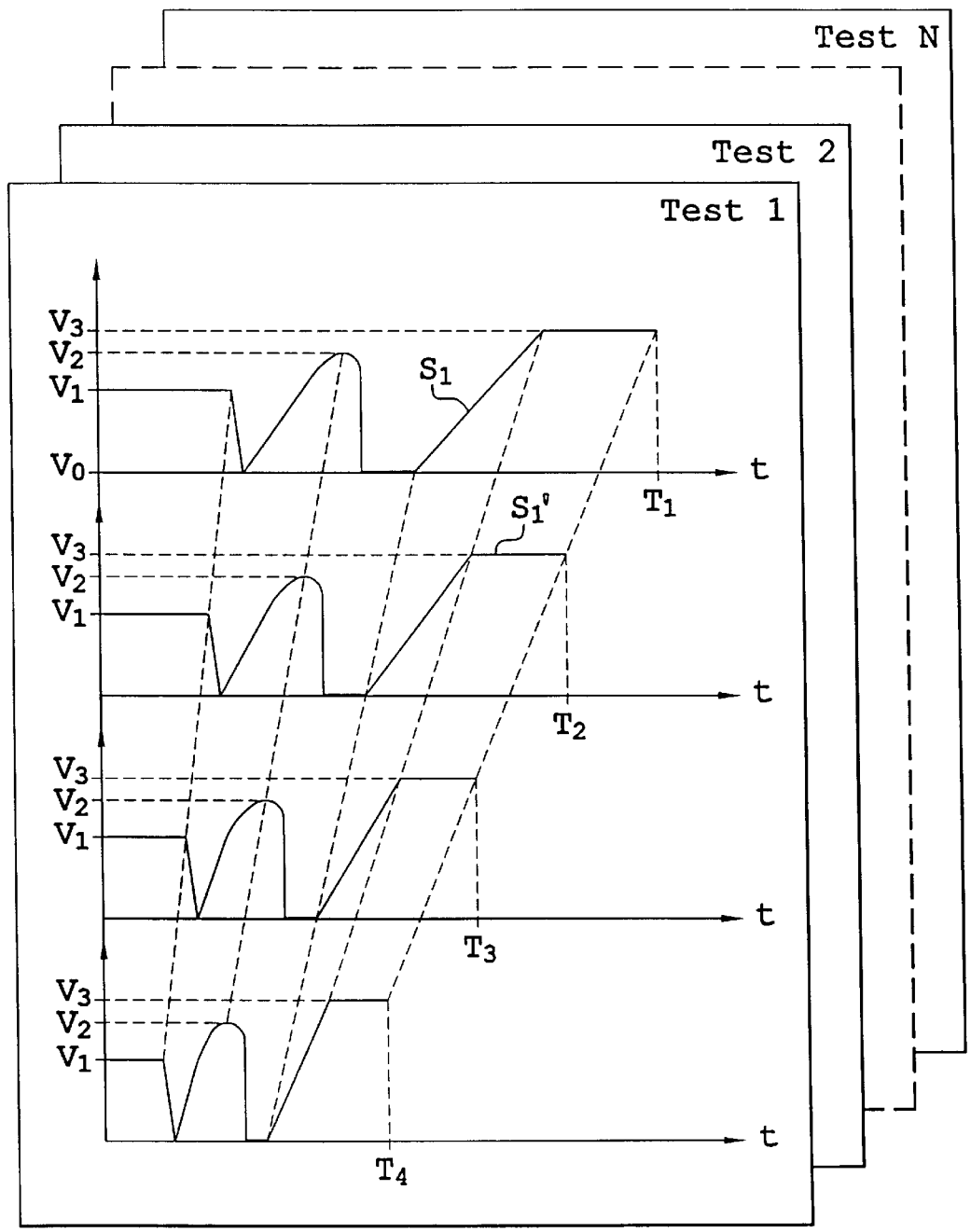
FIG. 2a shows a set of historical patterns of signals of the test method according to the invention.
Figure 2B:
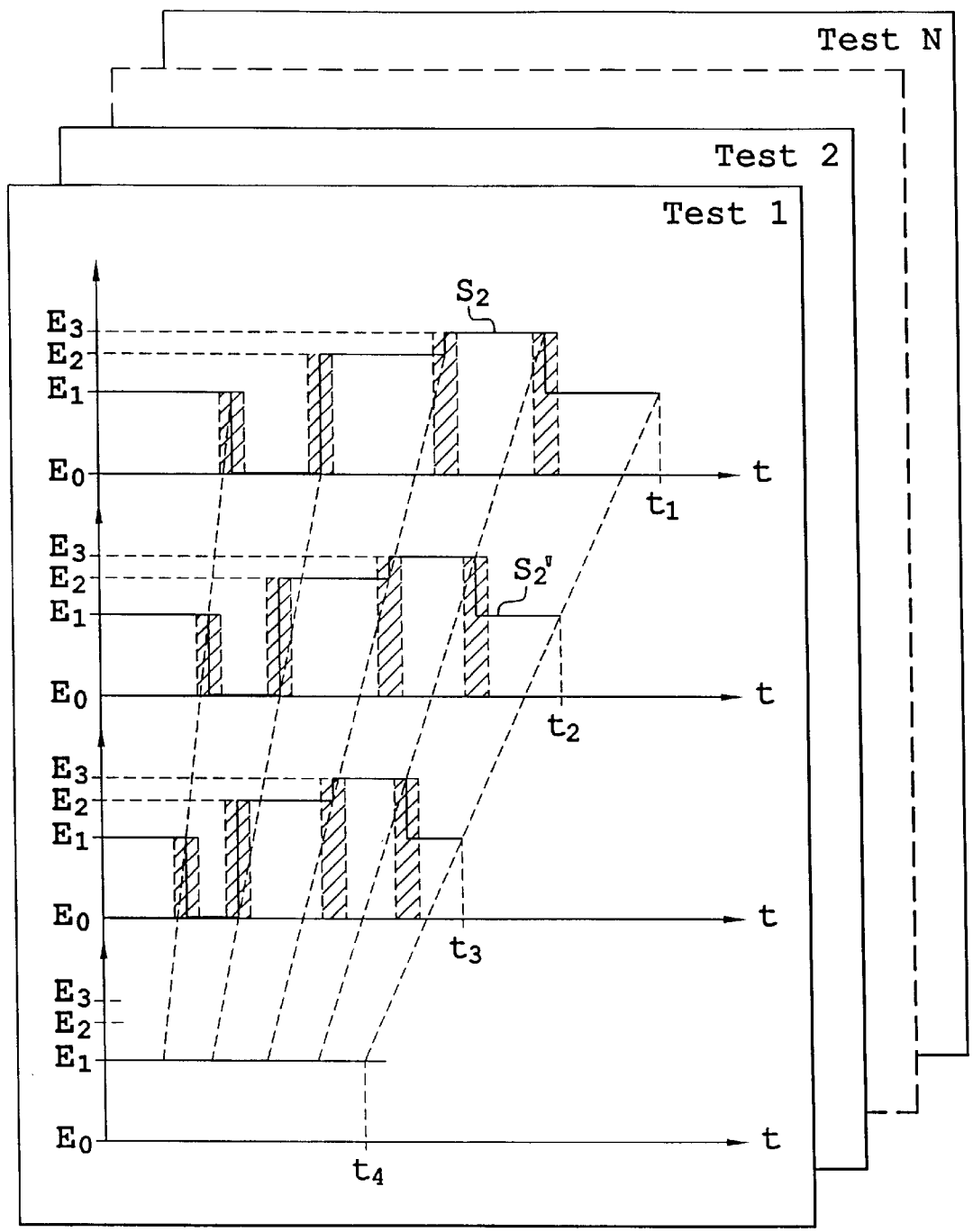
FIG. 2b shows a set of patterns of states that can be obtained with a test method according to the invention.

The method according to the invention for testing the electronic component 1 comprises especially the sending of a signal S1, shown in FIG. 2a. The signal S1 is given during a period of time T1. The signal S1 has a complex form. It is non-monotonic. Indeed, for a test Test1, the signal S1 shown in FIG. 2a begins with a first stationary phase at a value V1, then a sudden drop to a value V0, a slow rise up to a value V2 then a sudden drop again to the value V0, then a gradual linear rise up to a value V3 and finally a level phase at this value V3. This form here is arbitrary. It shows the non-monotonic and complex character of the first signals. The signal S1 is characterized by a historical pattern. Indeed, the different changes between the values V0 V1 V2 and V3, and the durations pertaining to each of these values form a historical pattern. This signal S1 is therefore sent to a cell 3 by means of the intermediate channel 4 of the cell 3 and an input terminal 6 of the component 1.

At the output 5 of the cell 3 and finally at an output pin 7 of the component 1, a result that is a consequence of the signal S1 sent is recovered. This result is constituted by a series of successive states through which the cell 3 passes following the reception of the signal S1. For example, a result may be a signal S2 of the type shown in FIG. 2b. In this example, the signal S2 is a succession, herein an arbitrary succession, of plateaux with distinct values: E1, then E0, then E2, then E3, then again E1.

This signal S2 is compared with an expected pattern of electrical states, or results. An expected pattern of results has lower and/or higher criteria of acceptance. Indeed, acceptance criteria of the expected pattern may be a tolerance with respect to an exact duration of each plateau, or again a tolerance with respect to the level of the plateau itself to be attained. Each plateau has a relative duration with respect to the other plateaux.

If the cell 3 is deemed to be acceptable with respect to the test made, then the test is performed again, according to the method of the invention, on this cell. For this, a signal S1' is used such that the duration of the historical pattern is proportional to that of the historical pattern of the signal S1. This signal to be sent S1' has a duration equal to T2, such that T2 is lower than T1. Consequently, a signal S2' at output of the cell 3 is studied. The signal S2' is constituted by a compressed pattern of electrical states of the cell 3. The component is deemed to be acceptable if the compressed pattern of states obtained conforms to an pattern of compressed states expected for this cell. Generally, it is expected that the signal S2' should be temporally proportional to the signal S2 and such that the difference between the signal S2 and the signal S2' lies chiefly in a proportional reduction of the respective durations of the states through which the cell passes. Criteria of acceptance with respect to these compressed pattern of states are therefore respectively reduced.

In one variant, it may be planned to compress only one temporal portion of the signal S1. Thus an S2 type response is obtained which, if the test is validated, is reduced equally on a corresponding same portion.

Thus, if the cell 3 is deemed to be again in conformity when it is tested with the compressed signal S1', then it may be decided to test other cells of the electronic component 1, or other electronic components such as 1, by using the input signal S1' to perform the test Test1. Thus, for each new test performed, the time difference between T1 and T2 is gained. Furthermore, this method may be reiterated so as to gradually reduce the duration of the test Test1, within the limits in which an output signal obtained still conforms to what is required.

In a first variant, it may be decided to perform only one iteration, according to the method of the invention, per cell of the component. Thus, a gradual cell-by-cell reduction is made in the test time. In a second variant, it may be decided to use the compressed test time only after this new type of test has been validated on several successive cells.

In a preferred example of the invention, to compress the duration T1 of the historical pattern S1, a clock is used. Indeed, in this example, the characteristics of the signal S1 are entered in a table. The table is gradually read at the rate of the clock in such a way that an analog-digital converter converts the data elements given by this table into a corresponding electric signal. The clock then enables the definition of a step of conversion of the values registered in the table by the analog-digital converter. Depending on the size of the step chosen, a signal is then obtained with the same characteristics of values but capable of being executed with varying speed. In this case, whatever the duration of transmission of the corresponding signal, the signal S1 has an identical number of samples taken in the table.

In one variant, there is a clock available. This clock is set with a given conversion step. In this case, to obtain a variation in the transmission time of a given signal, it is possible to make a reduced table. This reduced table is obtained by carrying out a sampling operation among the values of the first table. Thus, a second table is obtained comprising, on the whole, the same characteristics as the first table. However, this second table will lead to a signal with a duration smaller than that obtained with the first table because it will correspond to the reading of fewer samples. However, this variant is more difficult to implement because it calls for the creation of numerous tables to obtain numerous compressed durations or desired historical patterns of sent signals.

A cell of the component may comprise several tests to be performed. For example, it may be desired to perform tests Test1, Test2, up to a TestN on this component. For each of these tests, the method according to the invention can be applied. Hence it is possible, for each of these tests, to compress the time needed to send respective S1 type signals having a non-monotonic historical pattern. The advantage of the invention lies in the fact that each of these respective durations can be compressed independently at each of the tests test 1, test 2, . . . test N. Thus each test is optimized independently.

Furthermore, a component according to the invention, especially a memory 1, comprises several input pints such as 6 and several output pins such as 7. It is therefore possible to simultaneously test several cells such as 3 located inside this component 1. Indeed, through each of the input pins 6, it is possible to respectively reach an equivalent number of cells 3 inside the component 1. Hence, an S1 type signal is sent on each of the cells? This S1 type signal corresponds to a given test. The signals sent, in relation to the tests being performed, may even be different from one cell to another. Similarly it is possible, according to the method of the invention, to respectively reduce the durations of the sent signals for each of these tests, the tests being each performed on a cell independently.

Figure 3:
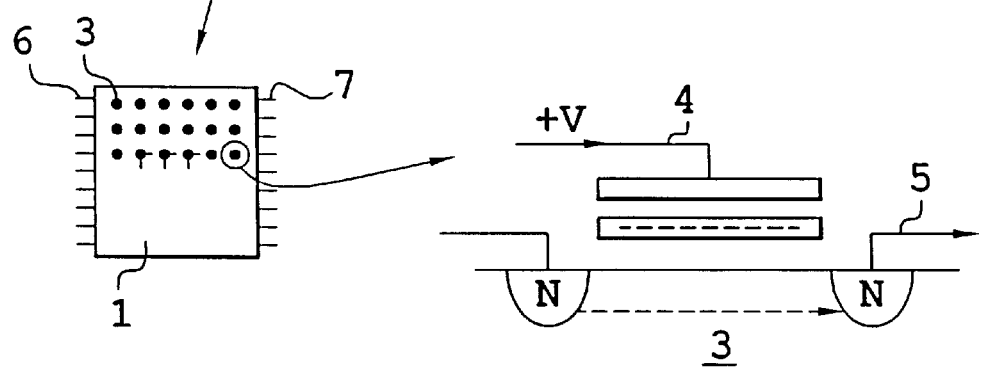
FIG. 3 is a table of gradual reduction of durations of the performance of tests according to the method of the invention.

Given that, in this case, signals are sent simultaneously on pins of one and the same component and therefore very close to each other, there are risks of radiation related to the transmission frequencies of the signals that may appear. Indeed, coupling phenomena may be seen between the signals sent or received by the different pins. In this case, the method according to the invention proposes to optimize a duration of performance of a test through the simultaneous carrying out of the tests that must be sent simultaneously to all the cells to be tested, so as to take account also of these coupling phenomena during the compression of the duration of a test according to the method of the invention. Indeed, if one of the signal patterns sent is modified, this may cause interference in the other signals sent, or in the electrical states resulting therefrom at output. Thus, as shown in FIG. 3, it is possible to have simultaneously or successively performed all the tests, Test1, Test2, TestN, with a compression rate Tr1. These tests can then be performed with a higher compression rate Tr2 (shorter duration). The success of these tests on the tested component is taken into account by a cross in the table. For a rate Tr3, it is possible that only the test Test2 gives the "accepted" verdict, for a component which is known to be acceptable since it has already met the requirements of all the tests with the rate Tr2. In this case, it will have been determined that the rate Tr3, during a campaign of tests on all the other cells of circuits of the component 1 (or on other components), will be applicable only to the test Test2, the rate Tr2 having to be applied to the other tests. Consequently, the tests Test1 up to TestN are performed simultaneously with minimum times.

In the method of the invention it is possible to set up a relationship between the minimum compressed time obtained as a result of the performance of a test, for example the test Test1, on a cell, 3, and the initially planned time T1. Thus compression rates may be defined. It is possible to define a compression rate made for a given cell and for a given test. The knowledge of these compression rates may enable an assessment of the cell to be assessed and, more comprehensively, of the electronic component comprising this cell, according to an assessment scale which may be more precise than a ranking of acceptable and unacceptable components. Indeed, it is possible to set up a scale of values for these components. It is possible for example to assign points to acceptable components and to rank them according to their compression rates obtained in the different tests. The tested components can thus be ranked according to a range of values used to identify those among the acceptable components whose performance is even better than expected. Similarly, it is possible to do a ranking of the unacceptable components.

The test method according to the invention can also be used to test the read and write capacities of an electronic component, for example a memory type component, at the end of a certain period of time. An ageing operation is therefore carried out between a read operation that corresponds to the sending of an S1 type signal and a read operation that corresponds to a measurement of an S2 type result. This ageing consists especially in subjecting the component to successive temperature variations. Indeed, this ageing operation, which corresponds to a theoretical ageing of six months, is performed within a few hours, generally two hours. Then the test method according to the invention is performed on these components aged according to this method.

When memory cells are tested, generally at the end of each test, a total erasure of the memory is carried out, so as to make a memory completely blank at the end of the test.

What is claimed is:

1. A method for the testing of an electronic component wherein:
   a first signal is sent, with a first duration, with a first non-monotonic historical pattern, to a first cell of the component through an input of the first cell,
   a measurement of a second signal available on an output of the first cell is made, said second signal being represented by a second historical pattern of the first cell,
   the component is accepted if the second pattern conforms to an expected pattern, wherein
   the duration of the historical pattern of the first signal sent to the input of the first cell is reduced,
   a second signal of reduced duration on the output of the first cell is measured as, said second signal of reduced duration being represented by a second historical pattern of reduced duration of the first cell, and
   the component is accepted if said second historical pattern of reduced duration conforms to an expected pattern of reduced duration.

2. A method according to claim 1 wherein:
   a clock is used to determine a step of sequencing of elements of the first historical pattern, and
   the step of this clock is diminished.

3. A method according to claim 1 wherein:
   a table is constituted from a sampling of the first historical pattern,
   a duration of sending of a signal whose historical pattern is a sequence of samples of this table corresponds to a reduced duration of the historical pattern.

4. A method according to claim 1 wherein:
   a group of tables is constituted from samplings of the first historical pattern,
   this group of tables representing possible historical patterns to obtain historical patterns of reduced duration with different compression rates.

5. A method according to claim 1 wherein:
   a test comprises several historical patterns to be tested on the cell of the component,
   respective durations of different historical patterns of fist signals are reduced differently.

6. A method according to claim 1 wherein:
   several circuits of one and the same electronic component are tested simultaneously.

7. A method according to claim 1 wherein:
   different compression rates are defined to reduce the duration of the historical patterns of first signals, each sent simultaneously to one of the circuits to be tested.

8. A method according to claim 1 wherein:
   the electronic component is qualified as a function of the compression rate implemented to reduce the duration of the historical pattern of the first signal.

9. A method according to claim 1 wherein:
   a first signal is sent to a following circuit of a component or to a following component, this first signal having a historical pattern that is the historical pattern of reduced duration defined for a circuit or a component previously tested.

10. A method according to claim 1 wherein:
    the component is aged by making it undergo repeated temperature variations, then
    a first signal with a first duration, with a first non-monotonic historical pattern, is sent to a first cell of the component, and
    a measurement of a second signal available on an output of the fist cell is made, said second signal being represented by a second historical pattern of the first cell.

11. A method according to claim 1 wherein:
    as a first signal, a programming signal is sent to a memory cell of an integrated circuit memory of the electronic component, in particular, a Flash-EPROM type memory,
    the memory cell is erased at the end of the test.

12. A method for the testing of an electronic component including a plurality of cells, the method comprising:
    sending a first signal to an input of a first cell of the component, the first signal having a first duration and a first non-monotonic historical pattern of states,
    measuring a second signal at an output of the first cell of the component, wherein the second signal is represented by a second historical pattern of states,
    as a first acceptance test, determining if the second historical pattern of states conforms to an expected pattern of states,
    if the first cell passes the first acceptance test, sending a first compressed signal to the input of the first cell, wherein the first compressed signal is a compressed version of the first historical pattern of states and has a reduced duration with respect to the first signal, and
    measuring a second compressed signal on the output of the first cell, the second compressed signal being represented by a second compressed historical pattern of states,
    as a second acceptance test, determining if the second compressed historical pattern conforms to an expected compressed pattern of states, and if so, using the first compressed signal as a first signal to subsequently test a second cell of the component.

13. A method according to claim 12, wherein the first historical pattern of states is controlled by a first clock defining a speed of transmission to the first cell and the first compressed signal comprises the same first historical pattern of states as the first signal but is controlled by a faster clock than the first clock.

14. A method according to claim 12, wherein the first historical pattern of states is presented by values in a first table, a reduced table is created by performing a sampling of the values in the first table, and the first compressed signal comprises a compressed pattern of states corresponding to the values in the reduced table.

15. A method according to claim 14, wherein additional reduced tables are created by performing various samplings of the values in the first table, and a plurality of compressed signals having varying durations can be obtained, wherein a selected compressed signal comprises a compressed pattern of states corresponding to a selected reduced table.

16. A method according to claim 12, wherein a plurality of tests are performed on a first cell, wherein each test includes applying an individual historical pattern of states to the first cell, and wherein the corresponding compressed signal for each historical pattern has a duration that is determined independently of the other tests.

17. A method according to claim 12, wherein several cells of one and the same electronic component are tested simultaneously.

18. A method according to claim 17, wherein different compression rates are defined to compress historical patterns of first signals, each sent simultaneously to one of the cells to be tested.

19. A method according to claim 12, wherein the electronic component is qualified as a function of the compression rate implemented to compress the duration of the historical pattern of the first signal.

20. A method according to claim 12, wherein the component is aged by making it undergo repeated temperature variations, then a first signal with a first duration with a first non-monotonic historical pattern of states is sent to the first cell of the component.

21. A method according to claim 12, wherein the electronic component is a flash-EPROM type memory having a plurality of memory cells, and the first signal is a programming signal sent to a first memory cell, and wherein the method includes the step of erasing the memory cell at the end of the test.

22. A method according to claim 12, wherein if the second cell of the component also passes the second acceptance test, a further compressed signal is sent to the second cell, wherein the further compressed signal is compressed with respect to the first compressed signal, and has a reduced duration with respect to the first compressed signal, a further second signal is measured on an output of the second cell, and the further second signal is compared to an expected further second signal, in order to determine whether the further compressed signal is useful as a first signal to be sent to the input of subsequently tested cells.

* * * * *